United States Patent
Mueller et al.

(10) Patent No.: US 10,844,515 B2
(45) Date of Patent: Nov. 24, 2020

(54) SEMICONDUCTOR WAFER MADE OF MONOCRYSTALLINE SILICON, AND METHOD FOR PRODUCING SAME

(71) Applicant: SILTRONIC AG, Munich (DE)

(72) Inventors: Timo Mueller, Burghausen (DE); Walter Heuwieser, Stammham (DE); Michael Skrobanek, Freiberg (DE); Gudrun Kissinger, Lebus (DE)

(73) Assignee: SILTRONIC AG, Munich (DE)

( * ) Notice: Subject to any disclaimer, the term of this patent is extended or adjusted under 35 U.S.C. 154(b) by 60 days.

(21) Appl. No.: 15/780,196

(22) PCT Filed: Dec. 2, 2016

(86) PCT No.: PCT/EP2016/079572
§ 371 (c)(1),
(2) Date: May 30, 2018

(87) PCT Pub. No.: WO2017/097675
PCT Pub. Date: Jun. 15, 2017

(65) Prior Publication Data
US 2018/0371639 A1    Dec. 27, 2018

(30) Foreign Application Priority Data
Dec. 11, 2015 (DE) .......... 10 2015 224 983

(51) Int. Cl.
*C30B 15/20* (2006.01)
*C01B 33/02* (2006.01)
(Continued)

(52) U.S. Cl.
CPC ............ *C30B 15/203* (2013.01); *C01B 33/02* (2013.01); *C30B 15/04* (2013.01); *C30B 29/06* (2013.01);
(Continued)

(58) Field of Classification Search
CPC ....... C30B 15/203; C30B 15/04; C30B 29/06; C01B 33/02; H01L 21/02381;
(Continued)

(56) References Cited

U.S. PATENT DOCUMENTS

2006/0046431 A1* 3/2006 Blietz ................ H01L 21/2007
438/455
2006/0150894 A1   7/2006 Kobayashi
(Continued)

FOREIGN PATENT DOCUMENTS

CN      1932496 A     3/2007
CN      101671843 A   3/2010
(Continued)

OTHER PUBLICATIONS

G. Kissinger et al., "300 mm Czochralski Silicon Wafers Optimized With Respect to Voids With Laterally Homogeneous Oxygen Precipitation," Physica B: 407 (2012) pp. 2993-2997.

*Primary Examiner* — Didarul A Mazumder
(74) *Attorney, Agent, or Firm* — Brooks Kushman P.C.

(57) ABSTRACT

A semiconductor wafer comprising single-crystal silicon has defined concentrations of oxygen, nitrogen and hydrogen; the semiconductor wafer further contains BMD seeds having a density averaged over the radius of not less than $1 \times 10^5$ cm$^{-3}$ and not more than $1 \times 10^7$ cm$^{-3}$; surface defects having a density averaged over the radius of not less than 1100 cm$^{-2}$; and BMDs, whose density is not lower than a lower limit of $5 \times 10^8$/cm$^3$. The semiconductor wafers are produced by a process which enables obtention of the required ranges of concentrations of oxygen, nitrogen, hydrogen, BMD seeds, and BMD's.

12 Claims, 8 Drawing Sheets

(51) Int. Cl.
*H01L 29/34* (2006.01)
*C30B 29/06* (2006.01)
*C30B 15/04* (2006.01)
*H01L 21/02* (2006.01)
*H01L 21/78* (2006.01)
*H01L 29/16* (2006.01)

(52) U.S. Cl.
CPC .. *H01L 21/02381* (2013.01); *H01L 21/02532* (2013.01); *H01L 21/02625* (2013.01); *H01L 21/02658* (2013.01); *H01L 21/7806* (2013.01); *H01L 29/16* (2013.01); *H01L 29/34* (2013.01); *C01P 2006/80* (2013.01)

(58) Field of Classification Search
CPC ......... H01L 21/02532; H01L 21/02625; H01L 21/02658; H01L 21/7806; H01L 29/16; H01L 29/34; C01P 2006/80
USPC ........................................................ 257/798
See application file for complete search history.

(56) References Cited

U.S. PATENT DOCUMENTS

| | | | |
|---|---|---|---|
| 2007/0044709 | A1 | 3/2007 | Itou et al. |
| 2008/0113171 | A1* | 5/2008 | Nakai ................... C30B 15/206 428/218 |
| 2010/0059861 | A1 | 3/2010 | Mueller et al. |
| 2011/0084366 | A1 | 4/2011 | Nakai et al. |
| 2011/0156216 | A1* | 6/2011 | Nakai ..................... C30B 15/04 257/617 |
| 2011/0263126 | A1* | 10/2011 | Harada ................. C30B 15/203 438/691 |
| 2013/0175726 | A1 | 7/2013 | Minami et al. |
| 2016/0032491 | A1* | 2/2016 | Lu ......................... C30B 15/203 428/357 |

FOREIGN PATENT DOCUMENTS

| | | |
|---|---|---|
| EP | 1 887 110 A1 | 2/2008 |
| EP | 1 914 795 A1 | 4/2008 |
| JP | 2013-129564 A | 4/2013 |

* cited by examiner

SEMICONDUCTOR WAFER MADE OF MONOCRYSTALLINE SILICON, AND METHOD FOR PRODUCING SAME

CROSS REFERENCE TO RELATED APPLICATIONS

This application is the U.S. National Phase of PCT Appln. No. PCT/EP2016/079572 filed Dec. 2, 2016, which claims priority to German Application No. 10 2015 224 983.2 filed Dec. 11, 2015, the disclosures of which are incorporated in their entirety by reference herein.

BACKGROUND OF THE INVENTION

1. Field of the Invention

The invention relates to a semiconductor wafer made of single-crystal silicon and comprising oxygen, nitrogen and hydrogen, and to a process for producing such a semiconductor wafer. On account of its properties the semiconductor wafer is suitable in particular as a substrate wafer onto whose upper lateral surface (frontside) an epitaxial layer is deposited. A semiconductor wafer having a deposited epitaxial layer is also known as an epitaxial semiconductor wafer.

2. Description of the Related Art

Oxygen plays an important role in the formation of BMD defects (BMDs, Bulk Micro Defects). BMDs are oxygen precipitates grown from BMD seeds in the course of a heat treatment. They act as internal getters, i.e. as energy sinks for impurities and are therefore fundamentally advantageous. One exception is their presence at locations where the intention is to accommodate electronic components. To avoid the formation of BMDs at such locations an epitaxial layer may be deposited on the semiconductor wafer and provision made to accommodate the electronic components in the epitaxial layer.

However, it should be noted that the deposition of the epitaxial layer on the semiconductor wafer entails thermal stress on the semiconductor wafer in the course of which smaller BMD seeds are dissolved. The smaller BMD seeds are then no longer available to grow into BMDs after deposition of the epitaxial layer. One option for countering this is to subject the semiconductor wafer to a heat treatment prior to the deposition of the epitaxial layer to stabilize smaller BMD seeds or form BMDs that are no longer dissolved. However, such a heat treatment entails additional costs. Alternatively or additionally, a relatively high concentration of oxygen in the single crystal may be chosen in order to obtain the highest possible density of BMD seeds in the semiconductor wafer even after deposition of the epitaxial layer. US 2006/0150894 A1 discloses a process whereby the single crystal from which the semiconductor wafer originates is subjected to a heat treatment to form BMDs.

When the single crystal from which the semiconductor wafer originates is pulled according to the Czochralski method (CZ method) from a melt contained in a quartz crucible, the crucible material forms the source of oxygen incorporated into the single crystal and the semiconductor wafer derived therefrom. The concentration of oxygen incorporated may be controlled fairly precisely, for example by controlling the pressure and the flow of argon through the pulling apparatus or by tuning crucible and seed crystal rotation during the pulling of the single crystal or by employing a magnetic field which is applied to the melt or by a combination of these measures.

The presence of nitrogen in the single crystal promotes the formation of BMD seeds. Doping the single crystal with nitrogen is thus generally suitable for achieving higher densities of BMDs. The concentration of nitrogen in the single crystal may be adjusted within wide limits, for example by dissolving a nitrogenous material in the melt or by gassing the melt with a gas comprising nitrogen or a nitrogenous compound.

Also of particular importance during the pulling of a single crystal of silicon by the CZ method is the control of the ratio V/G of pulling velocity V and axial temperature gradient G at the crystallization interface. The pulling velocity V is the velocity at which the growing single crystal is lifted upward away from the melt and the axial temperature gradient G is a measure of the change in temperature at the crystallization interface in the direction of the crystal lifting. The type and concentration of point defects (vacancies and interstitial silicon atoms) that dominate in the single crystal are substantially determined by the V/G quotient. BMDs can be developed particularly in a region in which the number of vacancies exceeds the number of interstitial silicon atoms and in which vacancies therefore dominate. When there is a comparatively large supersaturation of vacancies present during crystallization of the single crystal, which is the case for a comparatively high V/G quotient, the vacancies form agglomerates which can be verified for example as COPs (Crystal Originated Particles). When V/G and thus the supersaturation of the vacancies is somewhat lower than would be necessary for formation of COPs, seeds of OSF defects (Oxidation Induced Stacking Faults) form instead of COPs. In this case the single crystal crystallizes in the OSF region. When the V/G quotient is smaller still, a region in which vacancies still dominate but which is classed as defect-free because COPs and OSFs are not formed therein is formed during crystallization of the single crystal. Such a region is referred to as a $P_v$ region. Further reduction of the V/G quotient causes the single crystal to grow in the $P_i$ region which is likewise classed as defect-free but in which interstitial silicon atoms dominate.

The axial temperature gradient G at the crystallization interface and the radial progression thereof are determined by the heat transport from and to the crystallization interface. The heat transport is in turn substantially influenced by the thermal properties of the environment of the growing single crystal, the so-called hot zone, and by the supply of heat through one or more heating apparatuses.

When it has been decided to pull a single crystal in a certain hot zone, the axial and radial progression of the axial temperature gradient G at the crystallization interface may be determined by means of simulation calculations which take into account the heat balance. Appropriate configuration of the hot zone can also ensure that the axial temperature gradient G has a desired progression along the radius of the single crystal. As a result of the growth of the single crystal and the reduction in the volume of the melt, the thermal conditions and thus also the axial progression of the axial temperature gradient G at the crystallization interface change over time. To keep the V/G quotient in an intended region in the axial direction it is thus also necessary to compensate for the change over time in the axial temperature gradient G through a corresponding change in the pulling velocity V. Controlling the pulling velocity V thus also makes it possible to control the V/G quotient.

WO 98/45508 A1 is one of numerous publications which describes how the progression of the pulling velocity V over time can be experimentally determined in order to achieve, through control of the pulling velocity V, the condition that the V/G quotient remains virtually unchanged during the growth of the single crystal and the single crystal can grow in an intended region. This document further describes verification methods for characterization and differentiation of $P_v$ region and $P_i$ region.

EP 1 887 110 A1 relates to the production of a semiconductor wafer which is made of single-crystal silicon, comprises oxygen, nitrogen and hydrogen and originates from a single crystal pulled in the $P_v$ region. It is reported that the presence of nitrogen and to a lesser extent that of hydrogen makes it possible to be able to utilize a larger range of pulling velocities in order to be able to crystallize the single crystal in the $P_v$ region. It is further proposed to choose a relatively high concentration of oxygen in the semiconductor wafer and to subject the semiconductor wafer to a heat treatment by RTA (rapid thermal anneal).

US 2011/0084366 A1 concerns the production of a semiconductor wafer which is made of single-crystal silicon, which comprises oxygen, nitrogen and hydrogen and whose frontside is covered with an epitaxial layer. It is apparent from the document that it is advantageous for the semiconductor wafer to comprise nitrogen and hydrogen in certain amounts. The presence of hydrogen counters the formation of OSFs in the semiconductor wafer and defects derived therefrom in the epitaxial layer without simultaneously impairing the activity of nitrogen as an additive that promotes the formation of BMD seeds. However, it is indicated that the presence of hydrogen in the semiconductor wafer can be responsible for the formation of dislocations in the epitaxial layer and that the agglomerates of vacancies are starting points for these dislocations.

The inventors of the present patent application have attended to the problem of providing a semiconductor wafer made of single-crystal silicon whose properties make it particularly suitable for use as a substrate wafer onto whose frontside an epitaxial layer is deposited. The inventors have in particular attended to the problem of providing a semiconductor wafer which is better suited for this purpose than corresponding semiconductor wafers that are described in US 2006/0150894 A1, EP 1 887 110 A1 and US 2011/0084366 A1. When the frontside of the provided semiconductor wafer is covered with an epitaxial layer, ideally no defects that are detected as overlay defects in a photolithography step, i.e. as local deformations of the semiconductor wafer having a deposited epitaxial layer, should be formed during the production of electronic components. Moreover, there should ideally be no scattered light centers detectable on the surface of the epitaxial layer that are caused by twin dislocations. Overlay defects and twin dislocations impair the yield of functional electronic components.

SUMMARY OF THE INVENTION

The foregoing problem are solved by a semiconductor wafer made of single-crystal silicon with a center, an edge and a radius R between the center and the edge, wherein the semiconductor wafer has:
an oxygen concentration of not less than $4.9 \times 10^{17}$ atoms/$cm^3$ and not more than $5.85 \times 10^{17}$ atoms/$cm^3$;
a nitrogen concentration of not less than $5 \times 10^{12}$ atoms/$cm^3$ and not more than $1.0 \times 10^{14}$ atoms/$cm^3$;
a hydrogen concentration of not less than $3 \times 10^{13}$ atoms/$cm^3$ and not more than $8 \times 10^{13}$ atoms/$cm^3$;
BMD seeds whose density averaged over the radius of the semiconductor wafer, determined by IR tomography, is not less than $1 \times 10^5$ $cm^{-3}$ and not more than $1 \times 10^7$ $cm^{-3}$;
surface defects whose density averaged over the radius is not less than 1100 $cm^{-2}$ determined by optical microscopy after heat treatments of the semiconductor wafer at a temperature of 900° C. over a period of 8 h in an atmosphere of nitrogen and at a temperature of 1100° C. over a period of 2 h in an atmosphere of oxygen and hydrogen; and
BMDs, whose density is not lower than a lower limit of $5 \times 10^8$/$cm^3$ determined along the radius from a radial position r=R/3 to a radial position r=R/1.15 by IR tomography after heat treatments of the semiconductor wafer at a temperature of 780° C. over a period of 3 h and at a temperature of 1000° C. over a period of 16 h.

The problem is further solved by a process for producing a semiconductor wafer made of single-crystal silicon, comprising
pulling a single crystal from a melt as per the CZ method at a pulling velocity V, wherein the melt is doped with oxygen, nitrogen and hydrogen and the single crystal grows at a crystallization interface;
controlling the incorporation of oxygen, nitrogen and hydrogen in a section of the single crystal having a uniform diameter in such a way that the oxygen concentration is not less than $4.9 \times 10^{17}$ atoms/$cm^3$ and not more than $5.85 \times 10^{17}$ atoms/$cm^3$, the nitrogen concentration is not less than $5 \times 10^{12}$ atoms/$cm^3$ and not more than $1.0 \times 10^{14}$ atoms/$cm^3$ and the hydrogen concentration is not less than $3 \times 10^{13}$ atoms/$cm^3$ and not more than $8 \times 10^{13}$ atoms/$cm^{3-}$;
controlling the pulling velocity V such that it is within a span $\Delta V$ within which the single crystal in the section having a uniform diameter grows in a $P_v$ region, wherein the pulling velocity V is in a subrange of the span which comprises 39% of the span and a lowest pulling velocity of the span is 26% greater than a pulling velocity at the transition from the $P_v$ region to a $P_i$ region; and
separating the semiconductor wafer from the section of the single crystal having a uniform diameter.

DETAILED DESCRIPTION OF THE PREFERRED EMBODIMENTS

A heat treatment of the semiconductor wafer or of the single crystal which is performed before the deposition of an epitaxial layer on the semiconductor wafer in order to generate and/or stabilize BMD seeds not dissolved during the deposition of the epitaxial layer is not a constituent of the process.

The inventors suspect the formation of overlay defects to be caused by stresses in the crystal lattice due to excessive densities of BMDs. Such stresses can also occur if the radial progression of the density of BMDs is excessively inhomogeneous. Furthermore, an excessively low density of BMDs can also bring about overlay defects because in such a case the activity of BMDs for blocking slip in the crystal lattice, so-called pinning, is too weakly pronounced. The formation of twin dislocations is suspected to be caused by BMD seeds which are relatively large but still too small to be able to form OSF defects.

The provided semiconductor wafer must therefore fulfill certain requirements. In terms of the concentration of oxygen, nitrogen and hydrogen the provided semiconductor wafer has the following properties:

The oxygen concentration of the semiconductor wafer as per new ASTM is not less than $4.9 \times 10^{17}$ atoms/cm$^3$ and not more than $5.85 \times 10^{17}$ atoms/cm$^3$, the nitrogen concentration is not less than $5 \times 10^{12}$ atoms/cm$^3$ and not more than $1.0 \times 10^{14}$ atoms/cm$^3$ and the hydrogen concentration is not less than $3 \times 10^{13}$ atoms/cm$^3$ and not more than $8 \times 10^{13}$ atoms/cm$^3$.

When the oxygen concentration is lower than the lower limit then, after the deposition of an epitaxial layer on the semiconductor wafer and after a heat treatment which allows BMD seeds to grow into BMDs, BMDs whose density along the radius of the semiconductor wafer is too inhomogeneous and remains below $3 \times 10^8$/cm$^3$ in places or completely are formed. To be able to achieve adequate activity as internal getters the density of BMDs should be not less than $3 \times 10^8$/cm$^3$. The oxygen concentration must not exceed the upper limit of $5.85 \times 10^{17}$ atoms/cm$^3$ either, because otherwise BMD seeds become too large and the semiconductor wafer after deposition of an epitaxial layer on the semiconductor wafer tends to form twin dislocations on the surface of the epitaxial layer. The oxygen concentration is preferably not more than $5.7 \times 10^{17}$ atoms/cm$^3$.

When the nitrogen concentration is lower than the lower limit of $5 \times 10^{12}$ atoms/cm$^3$ this results in the same disadvantages as the oxygen concentration lower than the lower limit. The nitrogen concentration upper limit of $1.0 \times 10^{14}$ atoms/cm$^3$ must not be exceeded because otherwise after deposition of an epitaxial layer on the semiconductor wafer and after a heat treatment which allows BMD seeds to grow into BMDs the semiconductor wafer comprises BMDs whose density is excessive. The density of BMDs is excessive when the density along the radius of the semiconductor wafer exceeds an upper limit of $2.5 \times 10^9$/cm$^3$ in places or completely. The nitrogen concentration is preferably not more than $3.5 \times 10^{13}$ atoms/cm$^3$.

The presence of hydrogen suppresses the formation of seeds of OSF defects and contributes to a uniformization of the radial progression of the density of BMDs, in particular in the edge region of the semiconductor wafer. The hydrogen concentration in the semiconductor wafer should therefore be not less than $3 \times 10^{13}$ atoms/cm$^3$. When the hydrogen concentration is smaller than the lower limit the radial progression of the density of BMDs in the edge region of the semiconductor wafer becomes too inhomogeneous. When the hydrogen concentration is greater than the upper limit of $8 \times 10^{13}$ atoms/cm$^3$ the semiconductor wafer tends after deposition of an epitaxial layer to form twin dislocations on the epitaxial layer. For this reason the single crystal of silicon from which the semiconductor wafer is separated is pulled in an atmosphere which comprises hydrogen, wherein the partial pressure of the hydrogen is preferably not less than 5 Pa and not more than 15 Pa.

Observing the recited concentration ranges with respect to oxygen, nitrogen and hydrogen is not in itself sufficient to solve the problem. In addition three further properties must be fulfilled:

The density of BMD seeds meaned over the radius of the semiconductor wafer, determined by IR tomography, is not less than $1 \times 10^5$ cm$^{-3}$ and not more than $1 \times 10^7$ cm$^{-3}$.

The mean density of surface defects determined along the radius of the semiconductor wafer is not less than 1100 cm$^{-2}$, preferably up to 10,000 cm$^{-2}$, determined by optical microscopy after a first heat treatment of the semiconductor wafer at a temperature of 900° C. over a period of 8 h in an atmosphere of nitrogen and a second heat treatment at a temperature of 1100° C. over a period of 2 h in an atmosphere of oxygen and hydrogen. When the mean density of surface defects falls below the value of 1100 cm$^{-2}$ this is an indication of an inhomogeneous distribution of BMD seeds.

The density of BMDs is not lower than a lower limit of $5 \times 10^8$/cm$^3$ when determined along the radius R of the semiconductor wafer from a radial position r=R/3 to a radial position r=R/1.15 by IR tomography after heat treatments of the semiconductor wafer at a temperature of 780° C. over a period of 3 h and at a temperature of 1000° C. over a period of 16 h.

To obtain a semiconductor wafer having the recited properties the wafer must originate from a single crystal pulled under certain conditions. During pulling of the single crystal the quotient V/G must remain within narrow limits within which the single crystal crystallizes with an appropriate excess of vacancies in the $P_v$ region. It is preferable when a $P_v$ region with an appropriate excess of vacancies is formed from the center of the single crystal to the edge thereof over a radial length of not less than 98% of the radius of the single crystal. The formation of a $P_v$ region having a comparatively small excess of vacancies must be excluded because in this case too few BMD seeds of sufficient size to withstand the deposition of an epitaxial layer on the semiconductor wafer are formed. However, the excess of vacancies must not be too great either and the radial progression thereof must not vary too much. Thus, the process window for the $P_v$ region must not be fully exploited.

These requirements are fulfilled by controlling the pulling velocity V to control the quotient V/G. In order that the single crystal grows with an appropriate excess of vacancies in the $P_v$ region, the pulling velocity V is controlled with the proviso that the velocity may not take every value in a span ΔV of pulling velocities that ensure growth of the single crystal in the $P_v$ region. The allowed pulling velocity is in a sub range of the span ΔV which comprises 39% of ΔV and whose lowest pulling velocity is 26% greater than the pulling velocity $V_{Pv/Pi}$ at the transition from the $P_v$ region to the $P_i$ region.

The pulling velocity $V_{Pv/Pi}$ and the span ΔV are experimentally determined, for example by pulling a test single crystal with linearly increasing or falling progress of the pulling velocity. The same hot zone as is intended for pulling a single crystal according to the invention is used. Every axial position in the test single crystal has a pulling velocity assigned to it. The test single crystal is cut axially and is examined for point defects for example by decoration with copper or by measuring the lifetime of minority charge carriers. The span ΔV extends from the lowest pulling velocity up to the highest pulling velocity at which $P_v$ region can be detected from the center to the edge of the test single crystal over a radial length of not less than 98% of the radius of the test single crystal. The lowest pulling velocity in this context is the pulling velocity $V_{Pv/Pi}$.

The pulling velocity V is preferably controlled in the recited fashion in the entire section of the single crystal having a uniform diameter so that all semiconductor wafers cut from this section have the intended properties. The diameter of the single crystal in this section and the diameter of the resulting semiconductor wafers is preferably not less than 200 mm, more preferably not less than 300 mm.

In order to promote the growth of the largest possible proportion of this section of the single crystal over a radial length of not less than 98% of the radius in the $P_v$ region with an appropriate excess of vacancies, it is advantageous to use a hot zone for the pulling of the single crystal on account of which the axial temperature gradient $G_c$ in the center of the crystallization interface is greater in a temperature range from the melting point to 1370° C. than the corresponding temperature gradient $G_e$ at the edge of the crystallization interface. The following preferably applies:

$1 < G_c/G_e \leq 1.15$

It is further advantageous to cool the single crystal to impede the formation of defects, for example the formation of seeds of OSF defects. The cooling rates are preferably not lower than:
1.7° C./min in the temperature range from 1250° C. to 1000° C.;
1.2° C./min in the temperature range from below 1000° C. to 800° C.; and 0.4° C./min in the temperature range from below 800° C. to 500° C.

It should be borne in mind that due to segregation, the concentration of nitrogen in the single crystal increases from the beginning to the end of the single crystal. In order to obtain the highest possible yields of semiconductor wafers according to the invention it is advantageous to set the axial progression of the concentrations of oxygen and nitrogen in the single crystal counter to one another. Thus the incorporation of oxygen into the single crystal should be controlled such that the initially comparatively low concentration of nitrogen is paired with a comparatively high concentration of oxygen and the concentration of oxygen decreases with increasing concentration of nitrogen. It is preferable when the concentration of oxygen in the section of the single crystal having a uniform diameter at a position 50 mm from the start of this section of the single crystal is not less than $5.4 \times 10^{17}$ atoms/cm³.

It is also preferable to set the concentration of hydrogen lower at the start of the section of the single crystal having a uniform diameter than at the end of this section. It is particularly preferable to set the partial pressure of the hydrogen in the atmosphere in which the single crystal is pulled in such a way that the partial pressure is in the range of a lower limit of 5 Pa at the start of the section of the single crystal having a uniform diameter, and is in the range of an upper limit of 15 Pa at the end of this section. For example, in the case of a single crystal of silicon having a diameter of at least 300 mm and a total length of the section having a uniform diameter of at least 2200 mm the partial pressure of hydrogen is set to not less than 5 Pa and not more than 7 Pa as far as half of the total length of the section of the single crystal having a uniform diameter, subsequently increased linearly until in terms of the partial pressure of the hydrogen, is not less than 12 Pa and not more than 15 Pa, and in terms of the length of this section of the single crystal 55% to 60% of the total length thereof have been reached and the partial pressure of the hydrogen is maintained until the section of the single crystal having a uniform diameter has reached the intended total length. This ensures, particularly at the start of the section of the single crystal having a uniform diameter, uniformization of the density of BMDs in the edge region of the subsequently resulting semiconductor wafer and avoids the formation of seeds of OSF defects particularly at the end of this section of the single crystal when the concentration of nitrogen is comparatively high. The limitation of the partial pressure of the hydrogen to the upper limit of 15 Pa moreover reduces the formation of larger BMD seeds from which after deposition of an epitaxial layer on the semiconductor wafer twin dislocations proceed. The presence of twin dislocations makes itself known by an increased number of so-called localized light scatterers (LLS).

A semiconductor wafer according to the invention is separated from a single crystal that has been pulled from a melt under the stated conditions by the CZ method. The upper lateral surface and the lower lateral surface and also the edge of the semiconductor wafer are subsequently subjected to one or more mechanical processing steps and at least one polishing. On the polished upper lateral surface of the semiconductor wafer an epitaxial layer is preferably deposited in a manner known per se. The epitaxial layer is preferably composed of single-crystal silicon and preferably has a thickness of 2 μm to 7 μm. The temperature during the deposition of the epitaxial layer is preferably 1100° C. to 1150° C. The semiconductor wafer and the epitaxial layer are doped with an electrically active dopant, for example boron, preferably analogously to the doping of a pp⁻-doped epitaxial semiconductor wafer.

The number of twin dislocations on the surface of the epitaxial layer is preferably less than 5.

The semiconductor wafer having an epitaxial layer obtained by deposition of an epitaxial layer onto the frontside of the semiconductor wafer has the potential, despite the deposition of the epitaxial layer, to be able to form BMDs whose density is sufficient to endow the semiconductor wafer with the necessary activity as an internal getter. However, the density of BMDs remains sufficiently low, and their radial progression sufficiently homogeneous, for problems due to overlay defects to be avoided.

The BMDs are preferably formed in the course of the production of electronic components in the epitaxial layer and attendant heat treatments. However, they can also be formed by subjecting the semiconductor wafer to one or more heat treatments after the deposition of the epitaxial layer and before the production of electronic components.

The density of BMDs in the case of the semiconductor wafer having an epitaxial layer is not less than $3 \times 10^8/cm^3$ and not more than $2.5 \times 10^9/cm^3$ determined from the center to the edge of the semiconductor wafer for an edge exclusion of 1 mm by IR tomography after heat treatments of the semiconductor wafer having an epitaxial layer at a temperature of 780° C. over a period of 3 h and at a temperature of 1000° C. over a period of 16 h.

A further quality attribute of the semiconductor wafer having an epitaxial layer is that the density of BMDs varies by not more than 80% based on a mean density, wherein the density of BMDs along the radius R of the semiconductor wafer having an epitaxial layer is determined from a radial position r=R/1.0791 to a radial position r=R/1.0135 by IR tomography after heat treatments of the semiconductor wafer having an epitaxial layer at a temperature of 780° C. over a period of 3 h and at a temperature of 1000° C. over a period of 16 h. Expressed in another way the following applies:

$$(D_{BMDmax} - D_{BMDmin})/D_{BMDmean} \leq 0.8$$

wherein $D_{BMDmean}$ refers to the density of BMDs meaned along an edge region and $D_{BMDmax}$ and $D_{BMDmin}$ refer to the largest and smallest density of BMDs within the edge region and the edge region extends from the radial position r=R/1.0791 to the radial position r=R/1.0135.

Determination of the Hydrogen Concentration:

To determine the hydrogen concentration, an object for measurement in the form of a cuboid block (3 cm×3 cm×30 cm) is cut from a single crystal. After a heat treatment of the object for measurement at a temperature of 700° C. over a period of 5 min and rapid cooling of the object for measurement the hydrogen concentration is measured by FTIR spectroscopy at room temperature. Before the FTIR measurement a portion of the hydrogen that would otherwise be withdrawn from the measurement is activated by irradiating the object for measurement with gamma rays from a $Co^{60}$ source. The energy dose of the radiation is 5000 to 21,000 kGy. A measurement campaign comprises 1000 scans at a resolution of 1 $cm^{-1}$ per object for measurement. Vibrational bands at wavenumbers of 1832, 1916, 1922, 1935, 1951, 1981, 2054, 2100, 2120 and 2143 $cm^{-1}$ are evaluated. The concentration of hydrogen is calculated from the sum of the integrated adsorption coefficients of the respective vibrational bands multiplied by the conversion factor $4.413 \times 10^{16}$ $cm^{-1}$. When the hydrogen concentration of a semiconductor wafer is to be measured the heat treatment of the object for measurement at a temperature of 700° C. is eschewed and a strip cut from the semiconductor wafer and having an area of 3 cm×20 cm is used as the object for measurement.

Measurement of the Density of BMD Seeds by IR Tomography:

The measurement of the density of BMD seeds by IR tomography (infrared laser scattering tomography) is effected along a radial broken edge of a semiconductor wafer whose crystal lattice is as-grown. In this state the semiconductor wafer has experienced no heat treatment that extinguishes BMD seeds or develops BMD seeds into BMDs. The method of measurement is known per se (Kazuo Moriya et al., J. Appl. Phys. 66, 5267 (1989)). Experimentally determined densities of BMD seeds reported here were determined with an MO-441 BMD-Analyzer measuring instrument from Raytex Corporation.

Measurement of the Density of BMDs by IR Tomography:

Before measurement the semiconductor wafer/the semiconductor wafer having an epitaxial layer is subjected to heat treatments at a temperature of 780° C. over a period of 3 h and at a temperature of 1000° C. over a period of 16 h. The measurement of the density of BMDs is then effected in the same way as in the case of the measurement of the density of BMD seeds.

Measurement of the Density of Surface Defects by Optical Microscopy:

Before measurement the semiconductor wafer is subjected to a first heat treatment at a temperature of 900° C. over a period of 8 h in an atmosphere of nitrogen and subsequently to a second heat treatment at a temperature of 1100° C. over a period of 2 h in an atmosphere of oxygen and hydrogen. An oxide layer that forms on the surface is removed with hydrogen fluoride after the two heat treatments. This is followed by a three minute delineation of surface defects with Secco etchant and counting of the number of surface defects by optical microscopy on the upper lateral surface of the semiconductor wafer along the radius thereof. All surface defects having a longest diagonal greater than 5 µm are included in the counting.

The invention is more particularly elucidated hereinbelow having reference to the figures.

Figure 1:
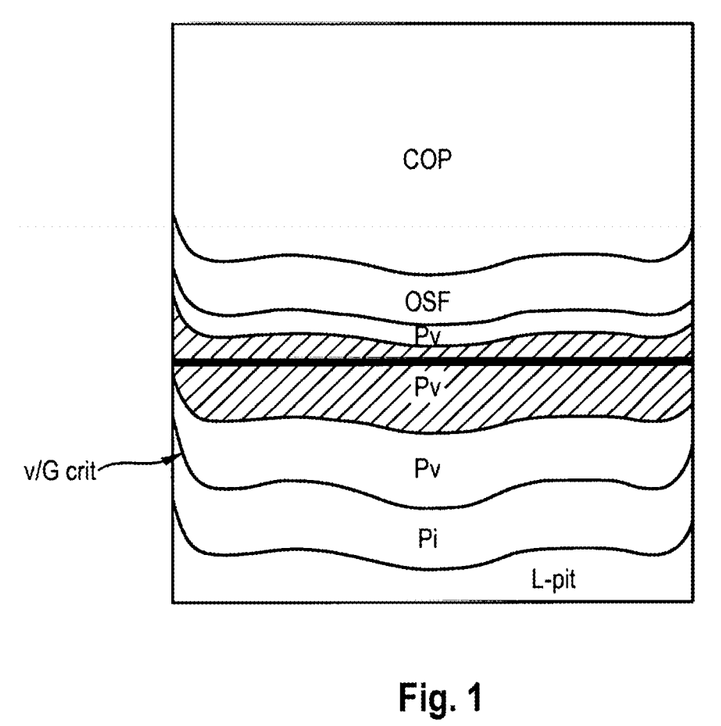
FIG. 1 shows how the material constitution of a single crystal of silicon changes from a region dominated by vacancies to a region dominated by interstitial silicon atoms as a function of the V/G quotient.

FIG. 1 shows how the material constitution of a single crystal of silicon changes from a region dominated by vacancies to a region dominated by interstitial silicon atoms as a function of the V/G quotient when the V/G quotient is changed during the pulling of the single crystal by the CZ method. What is shown is an axial section through a constant-diameter section of such a single crystal. The V/G quotient falls from top to bottom and varies along the diameter, i.e. from left to right. The regions COP, OSF and Pv are dominated by vacancies. The regions Pi and L-pit are dominated by interstitial silicon atoms. The $V/G_{crit}$ quotient refers to the V/G quotient at the transition from Pv region to Pi region. The $P_v$ region is subdivided into an upper, middle and lower domain. A semiconductor wafer according to the invention is composed of material from the hatched middle domain and is symbolized in this domain as a horizontal line. A semiconductor wafer composed from material of the upper or the lower domain of the $P_v$ region is not in accordance with the invention because the necessary radial homogeneity of the BMD density in particular cannot be achieved therewith.

Figure 2A:
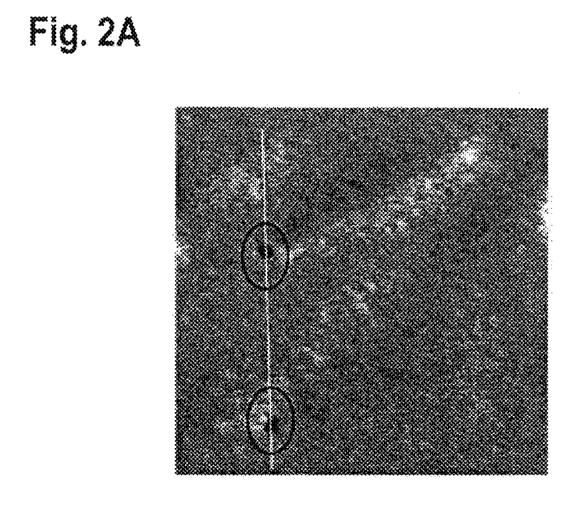
FIG. 2A shows a typical twin dislocation on an AFM micrograph of a measurement zone having an area of 10 μm×10 μm area.
Figure 2B:
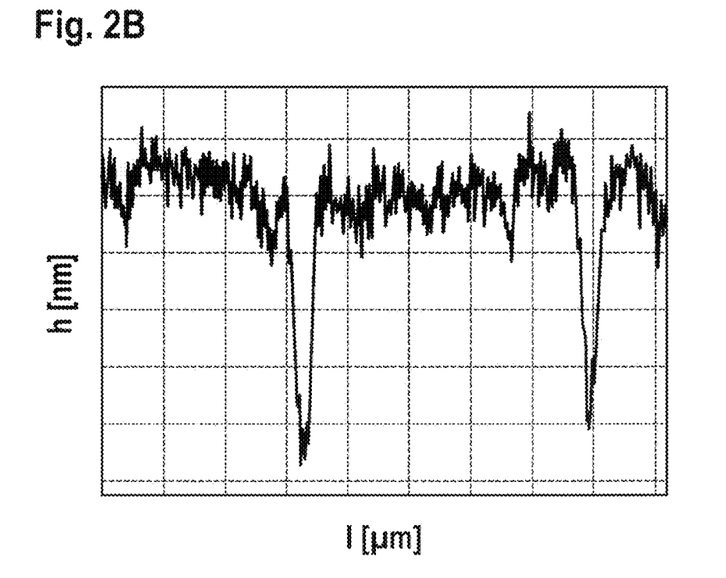
FIG. 2B shows the accompanying height profile (relative height h) along the pale line visible in FIG. 2A (length l).

FIG. 2A shows a typical twin dislocation on an AFM micrograph of a measurement zone having an area of 10 µm×10 µm area. FIG. 2B shows the accompanying height profile (relative height h) along the pale line visible in FIG. 2A (length l).

Figure 3:
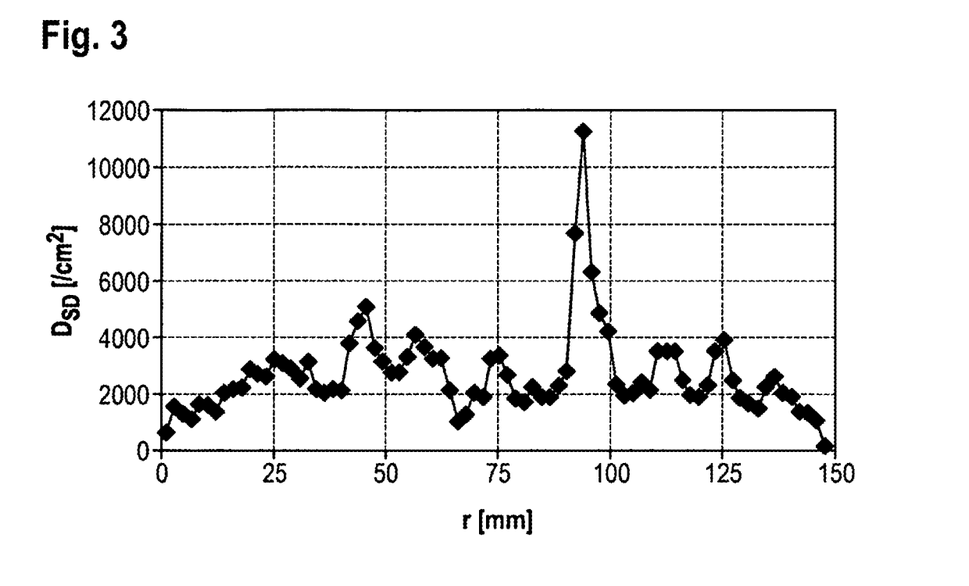
FIG. 3 shows the radial progression of the density of surface defects $D_{SD}$ using a semiconductor wafer that has been produced in accordance with the invention.

FIG. 3 shows the radial progression of the density of surface defects $D_{SD}$ using as an example a semiconductor wafer made of single-crystal silicon with a diameter of 300 mm that has been produced in accordance with the invention. The density $D_{SD}$ meaned over the radius R of the semiconductor wafer is above the required value of 1100/$cm^2$. The radius R extends from a radial position r in the center of the semiconductor wafer (r=0) to a radial position r at the edge of the semiconductor wafer (r=R).

Figure 4:
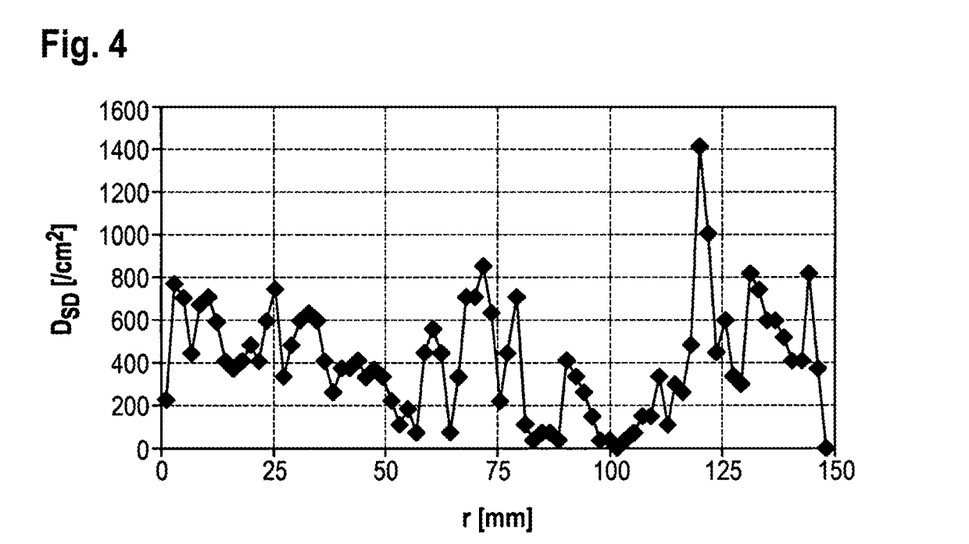
FIG. 4 shows the radial progression of the density of surface defects $D_{SD}$ using a semiconductor wafer that has not been produced in accordance with the invention.

For comparison, FIG. 4 shows the radial progression of the density of surface defects $D_{SD}$ using as an example a semiconductor wafer made of single-crystal silicon with a diameter of 300 mm that has not been produced in accordance with the invention. The density $D_{SD}$ meaned over the radius R of the semiconductor wafer is below the required value of 1100/cm².

Figure 5:
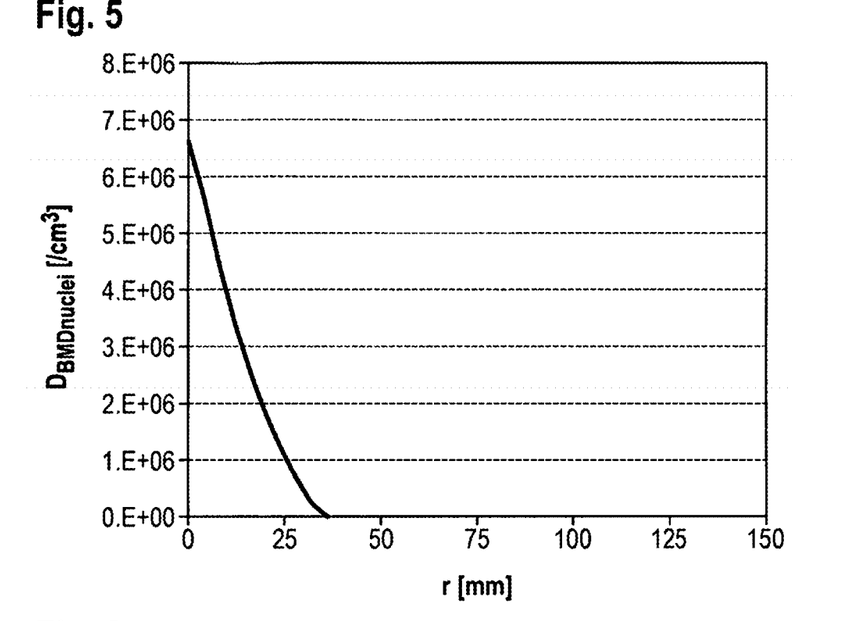
FIG. 5 shows the radial progression of the density of BMD seeds $D_{BMDnuclei}$ using a semiconductor wafer made produced in accordance with the invention.

FIG. 5 shows the radial progression of the density of BMD seeds $D_{BMDnuclei}$ using as an example a semiconductor wafer made of single-crystal silicon with a diameter of 300 mm that has been produced in accordance with the invention. The density $D_{BMDnuclei}$ meaned over the radius R of the semiconductor wafer is within the required range of not less than $1 \times 10^5$ cm⁻³ and not more than $1 \times 10^7$ cm⁻³.

Figure 6:
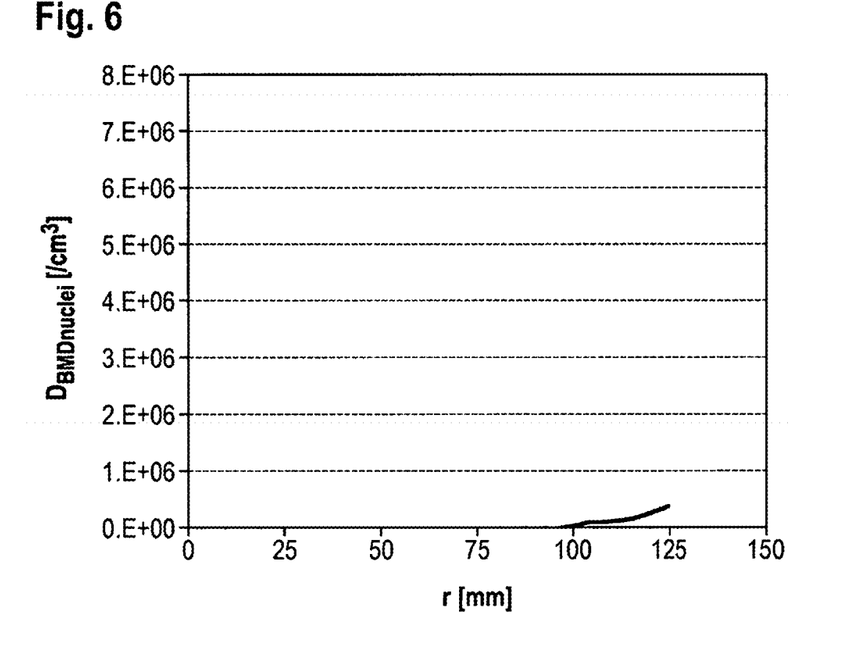
FIG. 6 shows the radial progression of the density of BMD seeds $D_{BMDnuclei}$ using a semiconductor wafer that has not been produced in accordance with the invention.

For comparison, FIG. 6 shows the radial progression of the density of BMD seeds $D_{BMDnuclei}$ using as an example a semiconductor wafer made of single-crystal silicon with a diameter of 300 mm that has not been produced in accordance with the invention. The density $D_{BMDnuclei}$ meaned over the radius R of the semiconductor wafer is not within the required range of not less than $1 \times 10^5$ cm⁻³ and not more than $1 \times 10^7$ cm⁻³.

Figure 7:
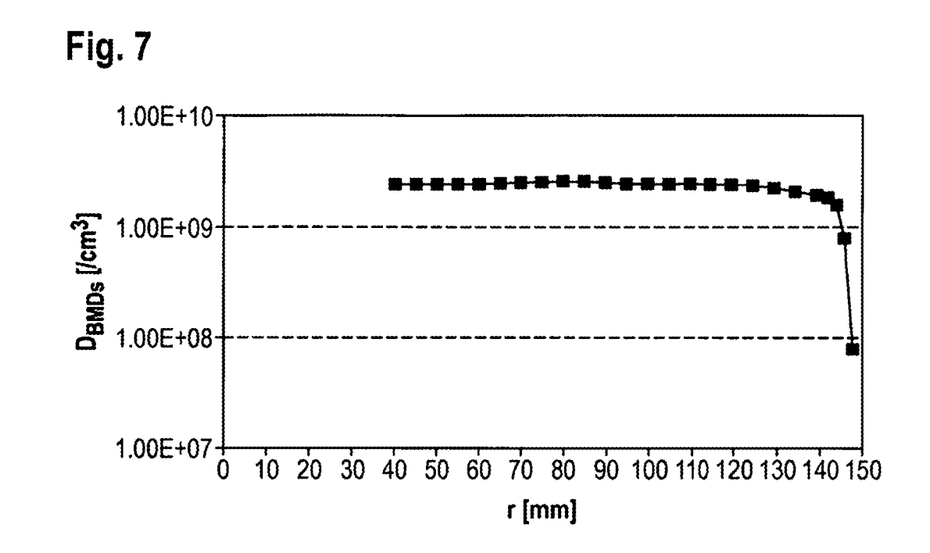
FIG. 7 shows the radial progression of the density of BMDs $D_{BMDs}$ from a radial position r=R/3 to the radius R of the semiconductor wafer using a semiconductor wafer that has been produced in accordance with the invention.

FIG. 7 shows the radial progression of the density of BMDs $D_{BMDS}$ from a radial position r=R/3 to the radius R of the semiconductor wafer using as an example a semiconductor wafer made of single-crystal silicon with a diameter of 300 mm that has been produced in accordance with the invention. During pulling of the single crystal the partial pressure of hydrogen of 12 Pa was in the required range. The minimum in the density of BMDs $D_{BMDS}$ in the range from r=R/3 to r=R/1.15 is above the required lower limit of $5 \times 10^8$/cm³.

Figure 8:
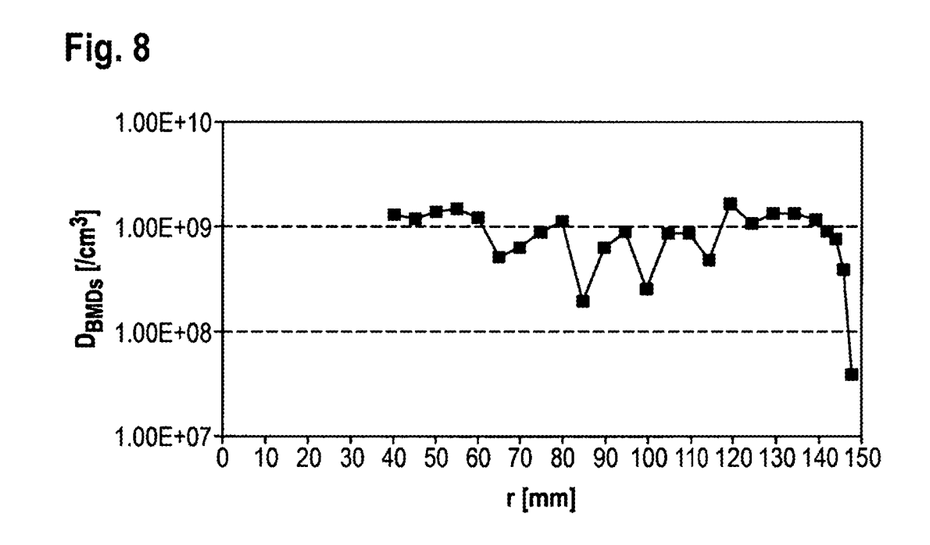
FIG. 8 shows the radial progression of the density of BMDs $D_{BMDs}$ from a radial position r=R/3 to the radius R of the semiconductor wafer using a semiconductor wafer that has not been produced in accordance with the invention.

For comparison, FIG. 8 shows the radial progression of the density of BMDs $D_{BMDS}$ from a radial position r=R/3 to the radius R of the semiconductor wafer using as an example a semiconductor wafer made of single-crystal silicon with a diameter of 300 mm that has not been produced in accordance with the invention. During pulling of the single crystal the partial pressure of hydrogen of below 5 Pa was lower than required. The minimum in the density of BMDs $D_{BMDS}$ in the range from r=R/3 to r=R/1.15 is below the required lower limit of $5 \times 10^8$/cm³.

Figure 9:
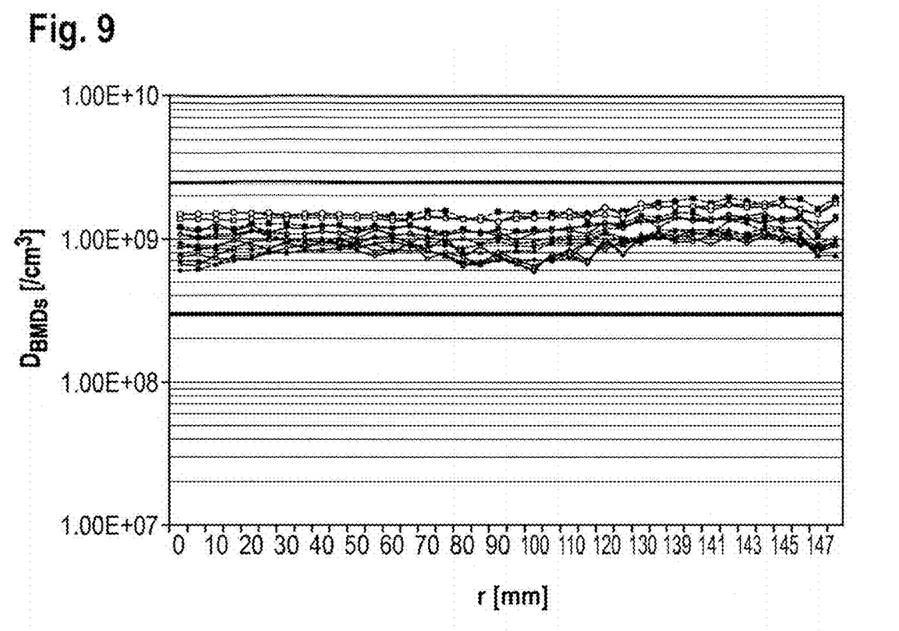
FIG. 9 shows the radial progression of the density of BMDs $D_{BMDs}$ along the radius R of the semiconductor wafer using semiconductor wafers produced in accordance with the invention.

FIG. 9 shows the radial progression of the density of BMDs $D_{BMDs}$ along the radius R of the semiconductor wafer using as an example semiconductor wafers made of single-crystal silicon with a diameter of 300 mm and with an epitaxial layer of silicon deposited on the frontside of the respective semiconductor wafer that have been produced in accordance with the invention. The radial progression of the density of BMDs is comparatively homogeneous irrespective of the axial position of the respective semiconductor wafer in the single crystal. In all cases the density of BMDs varies within a range from not less than $3 \times 10^8$/cm³ to not more than $2.5 \times 10^9$/cm³.

The table which follows contains data for semiconductor wafers made of single-crystal silicon with properties in accordance with the invention (examples B1 to B3) and semiconductor wafers which because of failure to meet one or more requirements (comparative examples V1 to V4) are non-inventive semiconductor wafers.

TABLE

|    | BMD seeds[1] [/cm³] | Surface defects[2] [/cm²] | BMD density [/cm³] | Position[3] [mm] |
|----|---------------------|---------------------------|---------------------|------------------|
| B1 | $1.19 \times 10^6$  | 2974                      | $2.22 \times 10^9$  | 72               |
| B2 | $1.21 \times 10^6$  | 1430                      | $1.11 \times 10^9$  | 57               |
| B3 | $2.99 \times 10^5$  | 2208                      | $2.17 \times 10^9$  | 62               |
| V1 | $2.15 \times 10^6$  | 962                       | $3.90 \times 10^9$  | 87               |
| V2 | $4.81 \times 10^4$  | 4130                      | $4.88 \times 10^9$  | 97               |
| V3 | $1.60 \times 10^4$  | 879                       | $3.21 \times 10^8$  | 85               |
| V4 | $1.93 \times 10^7$  | 1419                      | $7.22 \times 10^8$  | 77               |

[1] density of the BMD seeds averaged over the radius of the semiconductor wafer;
[2] density of the surface defects meaned over the radius;
[3] radial position of the minimum of the BMD density.

In contrast to the semiconductor wafers of examples B1 to B3 the semiconductor wafers of comparative examples V1 to V4 failed to meet one or more of the requirements with respect to the density of the BMD seeds, the density of the surface defects and the BMD density. After deposition of an epitaxial layer of silicon only the semiconductor wafers having an epitaxial layer based on the semiconductor wafers of the comparative examples had deficiencies either because of insufficient potential of the internal getter or because of the presence of overlay defects or because of a greater number of twin dislocations.

Figure 10:
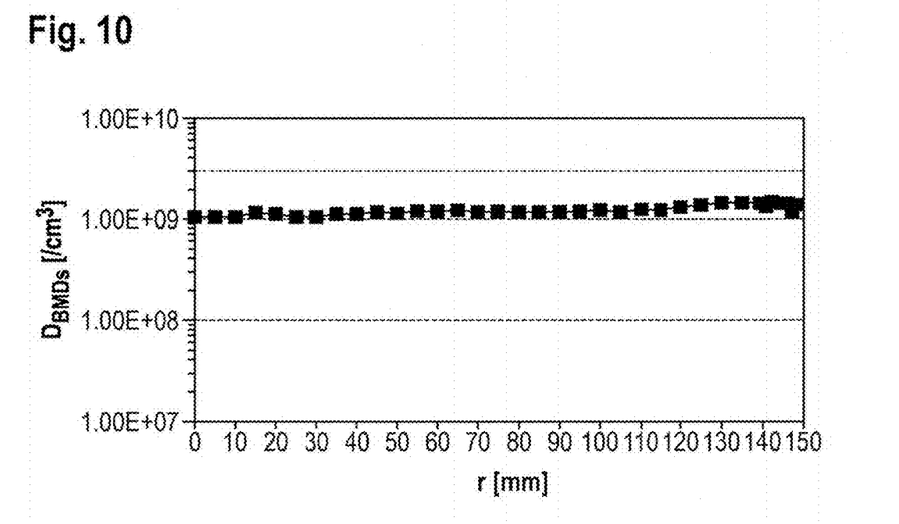
FIG. 10 shows the homogeneous radial progression of the BMD density of the semiconductor wafer having an epitaxial layer derived from the semiconductor wafer of example B3.

The semiconductor wafers having an epitaxial layer derived from the semiconductor wafers of examples B1 to B3 did not have such deficiencies. FIG. 10 shows the homogeneous radial progression of the BMD density of the semiconductor wafer having an epitaxial layer derived from the semiconductor wafer of example B3.

Figure 11:
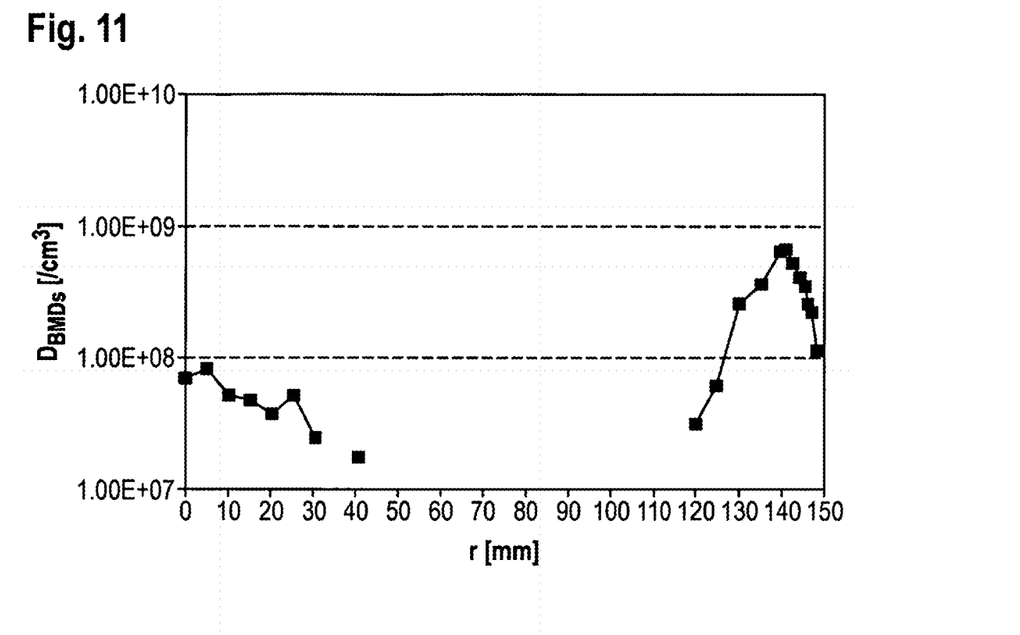
FIGS. 11 to 13 show the advantages of employing a comparatively high partial pressure of hydrogen at least during the pulling of the second half of the section of the single crystal having a constant diameter.
Figure 12:
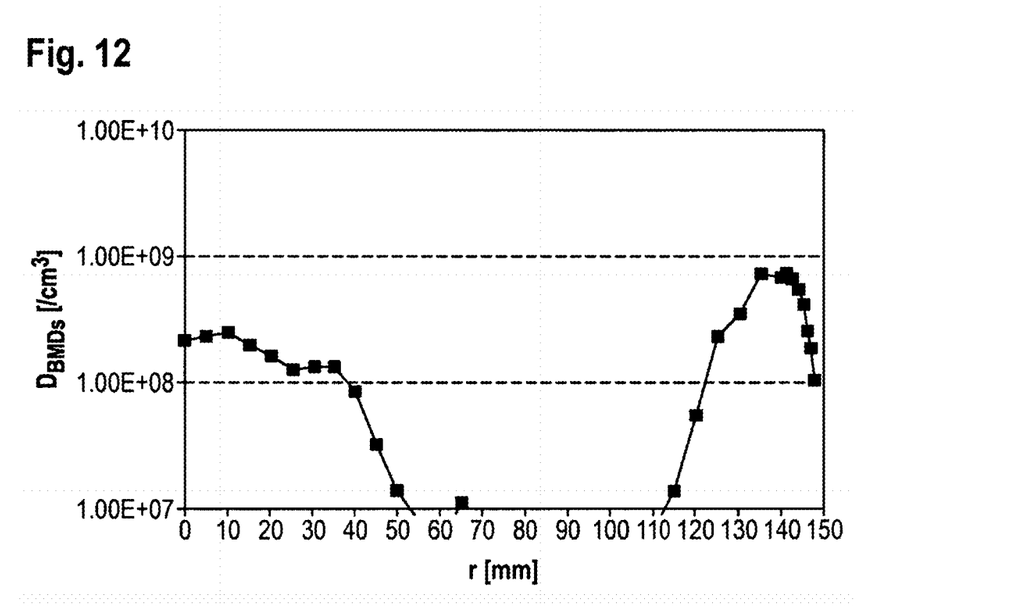
Figure 13:
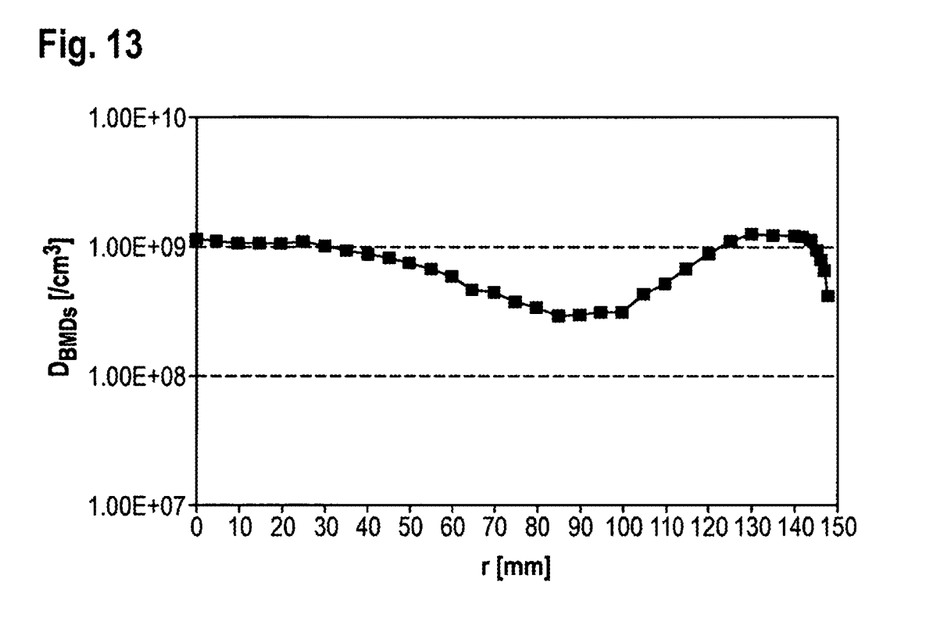

FIGS. 11 to 13 show that it is advantageous to employ a comparatively high partial pressure of hydrogen at least during the pulling of the second half of the section of the single crystal having a constant diameter. The BMD density of three semiconductor wafers made of single-crystal silicon with a diameter of 300 mm were determined after deposition of an epitaxial layer. The respective semiconductor wafers were cut from the single crystal at particular axial positions of the second half of the section having a constant diameter, wherein during pulling of the single crystal the partial pressure of hydrogen at the respective positions was different. The hydrogen partial pressure was 0 Pa at position 622 mm, 5 Pa at position 685 mm and 12 Pa at position 761 mm. Comparison of FIG. 11 (Position 622 mm), FIG. 12 (Position 685 mm) and FIG. 13 (Position 761 mm) shows that the BMD density of the corresponding semiconductor wafer having an epitaxial layer had a desired radially homogeneous progression with the desired values only in the case of the semiconductor wafer at position 761 mm.

The invention claimed is:

1. A semiconductor wafer comprising single-crystal silicon with a center, an edge and a radius R between the center and the edge,
   an oxygen concentration of not less than $4.9 \times 10^{17}$ atoms/cm³ and not more than $5.85 \times 10^{17}$ atoms/cm³;
   a nitrogen concentration of not less than $5 \times 10^{12}$ atoms/cm³ and not more than $1.0 \times 10^{14}$ atoms/cm³;
   a hydrogen concentration of not less than $3 \times 10^{13}$ atoms/cm³ and not more than $8 \times 10^{13}$ atoms/cm³;
   bulk micro defect ("BMD") seeds whose density averaged over the radius of the semiconductor wafer, as determined by infrared ("IR") tomography, is not less than $1 \times 10^5$ cm⁻³ and not more than $1 \times 10^7$ cm⁻³;
   surface defects whose density averaged over the radius is not less than 1100 cm' as determined by optical microscopy after heat treatments of the semiconductor wafer at a temperature of 900° C. over a period of 8 h in an atmosphere of nitrogen and at a temperature of 1100° C. over a period of 2 h in an atmosphere of oxygen and hydrogen; and bulk micro defects ("BMDs"), whose density is not lower than a lower limit of $5 \times 10^8/cm^3$ determined by IR tomography along the radius from a radial position r=R/3 to a radial position r=R/1.15 after heat treatments of the semiconductor wafer at a temperature of 780° C. over a period of 3 h and at a temperature of 1000° C. over a period of 16 h.

2. The semiconductor wafer of claim 1, wherein a frontside of the semiconductor wafer is covered with an epitaxial layer comprising silicon.

3. The semiconductor wafer of claim 2, wherein the density of BMDs is not less than $3 \times 10^8/cm^3$ and not more than $5 \times 10^9/cm^3$, determined from the center to the edge of the semiconductor wafer for an edge exclusion of 1 mm and evaluated by IR tomography after heat treatments of the semiconductor wafer at a temperature of 780° C. over a period of 3 h and at a temperature of 1000° C. over a period of 16 h.

4. The semiconductor wafer of claim 2, wherein the density of BMDs varies by not more than 80% based on a mean density, determined along the radius from a radial position r=R/1.0791 to a radial position r=R/1.0135 and evaluated by IR tomography after heat treatments of the semiconductor wafer at a temperature of 780° C. over a period of 3 h and at a temperature of 1000° C. over a period of 16 h.

5. The semiconductor wafer of claim 3, wherein the density of BMDs varies by not more than 80% based on a mean density, determined along the radius from a radial position r=R/1.0791 to a radial position r=R/1.0135 and evaluated by IR tomography after heat treatments of the semiconductor wafer at a temperature of 780° C. over a period of 3 h and at a temperature of 1000° C. over a period of 16 h.

6. A process for producing a semiconductor wafer of claim 1 from single-crystal silicon, comprising:
pulling a single crystal from a melt by the CZ method at a pulling velocity V, wherein the melt is doped with oxygen, nitrogen and hydrogen and the single crystal grows at a crystallization interface;
controlling the incorporation of oxygen, nitrogen and hydrogen in a section of the single crystal having a uniform diameter in such a way that the oxygen concentration is not less than $4.9 \times 10^{17}$ atoms/cm$^3$ and not more than $5.85 \times 10^{17}$ atoms/cm$^3$, the nitrogen concentration is not less than $5 \times 10^{12}$ atoms/cm$^3$ and not more than $1.0 \times 10^{14}$ atoms/cm$^3$ and the hydrogen concentration is not less than $3 \times 10^{13}$ atoms/cm$^3$ and not more than $8 \times 10^{13}$ atoms/cm$^3$;
controlling the pulling velocity V such that it is within a span ΔV within which the single crystal in the section having a uniform diameter grows in a $P_v$ region, wherein the pulling velocity V is in a subrange of the span which comprises 39% of the span and a lowest pulling of velocity of the subrange is 26% greater than a pulling velocity $V_{Pv/Pi}$ at the transition from the $P_v$ region to a $P_i$ region; and
separating the semiconductor wafer from the section of the single crystal having a uniform diameter.

7. The process of claim 6, further comprising pulling the single crystal in an atmosphere comprising hydrogen, wherein the partial pressure of the hydrogen is not less than 5 Pa and not more than 18 Pa.

8. The process of claim 6, further comprising increasing the partial pressure of the hydrogen once the section of the single crystal having a uniform diameter has reached an axial length greater than 50% of an intended axial length of this section.

9. The process of claim 6, further comprising increasing the partial pressure of the hydrogen once the section of the single crystal having a uniform diameter has reached an axial length greater than 50% of an intended axial length of this section.

10. The process of claim 6, wherein an epitaxial layer of silicon is deposited on a frontside of the semiconductor wafer.

11. The process of claim 6, wherein an epitaxial layer of silicon is deposited on a frontside of the semiconductor wafer.

12. The process of claim 6, wherein an epitaxial layer of silicon is deposited on a frontside of the semiconductor wafer.

* * * * *

UNITED STATES PATENT AND TRADEMARK OFFICE
CERTIFICATE OF CORRECTION

PATENT NO. : 10,844,515 B2
APPLICATION NO. : 15/780196
DATED : November 24, 2020
INVENTOR(S) : Timo Mueller et al.

It is certified that error appears in the above-identified patent and that said Letters Patent is hereby corrected as shown below:

In the Claims

Column 12, Line 62, Claim 1:
After "not less than"
Delete "1100cm'" and
Insert -- 1100cm$^{-2}$ --

Signed and Sealed this
Twenty-third Day of February, 2021

Drew Hirshfeld
*Performing the Functions and Duties of the*
*Under Secretary of Commerce for Intellectual Property and*
*Director of the United States Patent and Trademark Office*